United States Patent [19]

Gay et al.

[11] Patent Number: 4,714,876
[45] Date of Patent: Dec. 22, 1987

[54] CIRCUIT FOR INITIATING TEST MODES

[75] Inventors: Richard B. Gay; Harold S. Crafts, both of Fort Collins, Colo.

[73] Assignee: NCR Corporation, Dayton, Ohio

[21] Appl. No.: 851,620

[22] Filed: Apr. 14, 1986

[51] Int. Cl.[4] .............................................. G01R 17/02
[52] U.S. Cl. ............................... 324/73 R; 324/158 R
[58] Field of Search ............... 307/350, 360, 361, 540, 307/261, 264, 567, 570, 581; 324/73 R, 73 AT, 158 R, 158 T; 357/45

[56] References Cited

U.S. PATENT DOCUMENTS

| | | | |
|---|---|---|---|
| 4,229,670 | 10/1980 | Thommen et al. | 307/360 |
| 4,402,003 | 8/1983 | Blanchard | 357/43 |
| 4,425,516 | 1/1984 | Wanbass | 307/570 |
| 4,506,282 | 3/1985 | Baliga | 307/570 |
| 4,527,115 | 7/1985 | Mehotra et al. | 324/73 R |
| 4,618,872 | 10/1986 | Baliga | 307/581 |

FOREIGN PATENT DOCUMENTS

| | | | |
|---|---|---|---|
| 2539967 | 3/1977 | Fed. Rep. of Germany | 357/43 |
| 83/00407 | 2/1983 | World Int. Prop. O. | 357/43 |

OTHER PUBLICATIONS

"FET-Bipolar Integration", by Vora, IBM Tech. Disc. Bull., vol. 13, #5, 10/79, p. 1106.
"Bipolar and FET Integration on a Common Chip", by Kalter, IBM Tech. Disc. Bull., vol. 15, #12, 5/73, pp. 3755-3756.

Primary Examiner—Reinhard J. Eisenzopf
Assistant Examiner—W. Burns
Attorney, Agent, or Firm—Wilbert Hawk, Jr.; Casimer K. Salys; Floyd A. Gonzalez

[57] ABSTRACT

A circuit for adding a function such as a test mode to an integrated circuit includes a pad for receiving an enabling voltage when the added function is to be enabled, and a semiconductor device having an input terminal connected to the pad, a reference terminal for receiving a reference voltage, a diode junction having one side connected to the input terminal and its other side connected to the reference terminal for applying a bias across the diode junction, and an output terminal controlled by the diode junction such that current flows therethrough when the diode junction is forward biased, and does not flow when said diode junction is reversed biased. Also included is a load device connected to the output terminal of the semiconductor means for providing an electrical load when the diode junction is forward biased, and a conductor connected intermediate the semiconductor device and the load device for providing an output voltage of a first level when the polarity and magnitude of the enabling voltage applied to the pad is sufficient to forward bias the diode junction, and for providing an output voltage of a second level when the enabling voltage applied to the pad is not sufficient to forward bias the diode junction. An embodiment is also disclosed wherein the semiconductor device is a parasitic transistor with elements in common with an output driver transistor of an input /output circuit of an integrated circuit.

4 Claims, 5 Drawing Figures

4,714,876

CIRCUIT FOR INITIATING TEST MODES

BACKGROUND OF THE INVENTION

The present invention is related to a circuit for initiating a test mode, and is more particularly related to a circuit for use with an integrated circuit wherein a test mode may be initiated without interfering with other functions of the integrated circuit. The present invention is particularly useful with input/output circuits of an integrated circuit chip.

As technology has developed, more elements have been added to integrated circuit chips while their sizes have been reduced. With the addition of elements, the functions that a given chip can do has become more varied and complex. With the addition of more functions to a chip, it has become desirable to add more terminals or pads for inputting or outputting signals dependent on the function that a chip is performing. However, with the reduction of the size of the chip, the physical space for adding new pads to a chip has been greatly reduced. Thus, various circuits have been devised such that a pad may be used for inputting and outputting more than one signal or initiating more than one function of the chip.

U.S. Pat. No. 4,336,495 by Happe and issued June 22, 1982 for "Integrated Circuit Arrangement In MOS-Technology With Field-Effect Transistor," discloses test circuitry in an integrated circuit which may be used during fabrication to locate faults without providing an extra external test connection. The disclosed test circuitry uses an existing terminal of an integrated circuit that is activated by a voltage of opposite polarity to that used during normal operation.

U.S. Pat. No. 4,298,146 by Draheim et al., and issue Aug. 9, 1983 for "Test Circuit For MOS Devices" discloses a test circuit having two inputs, and in which the test circuit is enabled when a test signal of opposite polarity to that of the supply voltage is applied to the one of the inputs, and a test signal of the same polarity as that of the supply voltage but of a substantially higher magnitude is applied to the other input.

U.S. Pat. No. 4,450,402 by Owen, III and issued May 22, 1984 for "Integrated Circuit Testing Apparatus," discloses an integrated testing apparatus which provides bidirectional coupling of a high voltage either from a source internal to the integrated circuit to an external pin, or from the external pin to the internal source responsive to an enabling signal placed on a second external pin. The testing apparatus is substantially transparent to normal integrated circuit operation when the enabling signal is removed from the second external pin.

Moore et al., "Unique On-Chip Test Structures Enhance E-PROM Manufacturability," Electronics, Sept. 22, 1983, pp. 135–138, discusses E-PROMS having test modes accessed by taking a control pin to an extra high voltage level near 10 volts, and includes a cell having a high-voltage-sensing circuit. When activated by an extra high voltage, the cell lets its voltage propagate to the output of the cell, where the propagated voltage can be measured to determine voltage margins.

Prior art testing circuits in which the test mode is enabled by an extra high voltage require power supplies having a much broader voltage range, thus creating more spurious energy in the same amount of time as would be created by power supplies with lesser range requirements. Using high voltage to enable a testing function also requires that potentially damaging voltage be connected directly to external pins of an integrated circuit.

SUMMARY OF THE INVENTION

It is thus an object of the present invention to provide a circuit for adding a test function to an integrated circuit wherein the test function is initiated by applying a small voltage increase to an external pin of the integrated circuit.

It is another object of the present invention to provide a test circuit for use with an integrated circuit when the test circuit is enabled by placing an increased voltage on an external pin equal to the base-emitter voltage (VBE) of a single bipolar device.

It is another object of the invention to provide a test circuit for use with an input/output circuit of an integrated circuit wherein a function is added to the functions of the integrated circuit without changing the operations of the input/output circuit.

It is another object of the invention to provide a test circuit for use with an input/output circuit of an integrated circuit wherein the test circuit is enabled by applying an increased voltage to a pad of the input/output circuit.

It is a further object of the invention to provide a test circuit having a bipolar device for detecting an enabling signal, wherein the bipolar device is merged with an output driver transistor of an integrated circuit incorporating the test circuit.

These and other objects of the present invention will become apparent from the drawings and preferred embodiments disclosed herein.

DESCRIPTION OF THE PREFERRED EMBODIMENTS

Figure 1:
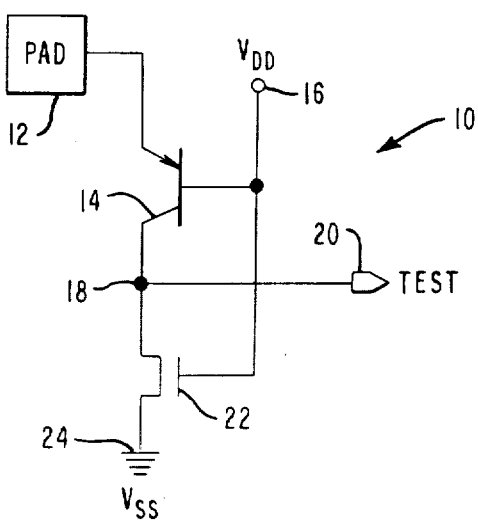
FIG. 1 is a schematic diagram of one embodiment of the present invention.

FIG. 1 is a schematic diagram of one embodiment of the present invention, and includes a circuit 10 which provides for the addition of a test function on a pad 12 of an integrated circuit chip (not shown). The circuit 10 includes a bipolar PNP transistor 14. The emitter of the PNP transistor 14 is connected to the pad 12, the base is connected to a voltage terminal 16 for receiving a voltage VDD, and its collector is connected to node 18. The node 18 is connected to a test output lead 20 for providing a test signal, either to a terminal for connection to a circuit exterior of the integrated circuit chip of which the circuit 10 is a part, or for providing a test signal to other circuitry (not shown) within the integrated circuit chip. The node 18 is also connected to the drain of an n channel enhancement type field effect transistor 22. The source of the transistor 22 is connected to electrical ground, or VSS, at 24, and the gate is connected to the VDD voltage terminal 16.

With the gate of the load transistor 22 connected to the VDD voltage terminal 16, the load transistor 22 will remain in the turned-on condition. The load transistor 22 has a turned-on resistance of about 4,000 ohms. Thus, it will be understood that when the bipolar transistor 14 turns on, current will flow through the turned-on resistance of the transistor 22, and voltage will appear at node 18 and test terminal 20. It will be seen that the voltage VDD on terminal 16 acts as a reference voltage. When an added function enabling voltage is applied to pad 12 which has a value of VBE (approximately 0.7 volts) above VDD, the emitter to base diode of the transistor 14 will be forward-biased, causing a current to flow through the load transistor 22. It will thus be understood that in the circuit 10 of FIG. 1, an added function such as a test capability may be added to the pad 12 by merely applying a voltage of VBE above VDD on the pad 12.

Figure 2:
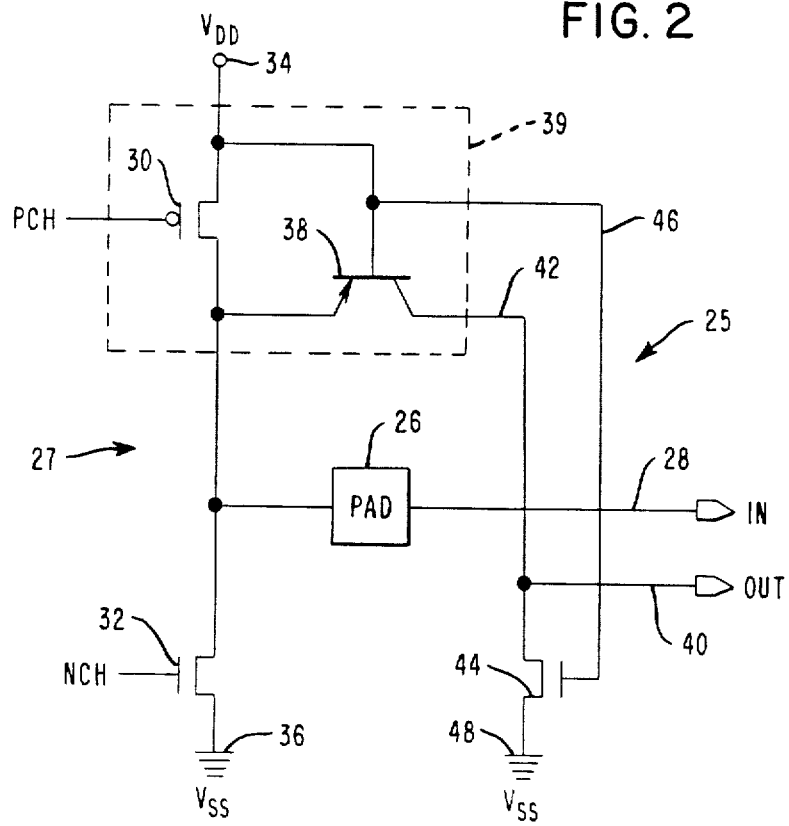
FIG. 2 is a schematic diagram of another embodiment of the present invention.

FIG. 2 shows a schematic diagram of another embodiment of the invention wherein an additional function, such as a test capability, is added to an input/output pad 26. The circuit 25 of FIG. 2 includes an input/output driver circuit 27 and an input lead 28 connected to the pad 26. The output driver circuit 27 includes a p-channel enhancement type field effect transistor 30, and an n-channel enhancement type field effect transistor 32. The source of the p-channel output driver transistor 30 is connected to a terminal 34 for receiving the voltage VDD. The drain of the p-channel output driver transistor 30 is connected to the pad 26 and to the drain of the n-channel output driver transistor 32. The source of the n-channel output driver transistor 32 is connected to electrical ground or VSS at 36. The gate of the p-channel output transistor 30 receives an output driver signal PCH, and the gate of the n-channel output driver transistor 32 receives the NCH driving signal. It will be understood that when the PCH signal on the gate of p-channel output driver transistor 30 is sufficiently negative with respect to VDD, the transistor 30 turns on, placing a high on pad 26. When the NCH signal on the gate of the n-channel output driver transistor 32 is sufficiently positive, the transistor 32 turns on placing a low on pad 26. The PCH and NCH signals are typically non-overlapping such that a desired output signal may be placed on pad 26 by an appropriate output circuit (not shown). Such output circuits are well-understood in the art, and need not be explained further herein.

Output driver transistors 30 and 32 also provide static discharge protection. Connected as shown in FIG. 2, output driver transistors 30 and 32 form clamping diodes which dissipate low energy high voltage spikes caused by static discharges on pad 26. The p channel output driver transistor 30 protects against positive-going static discharge voltage spikes, and the n-channel output driver transistor 32 protects the circuit against negative-going static discharge voltage spikes. It should be noted that the addition of the test driver circuit, to be described, does not alter or degrade the operation of the output driver transistors 30 and 32 as either output driver transistors or static discharge voltage protection devices.

The circuit 25 of FIG. 2 also includes a PNP bipolar transistor 38 whose emitter is connected to the drain of the p-channel output driver transistor 30, its base is connected to the VDD voltage terminal 34, and its collector is connected to a test output lead 40 by conductor 42. An n-channel enhancement-type transistor 44 has its drain connected to the collector of the bipolar transistor 38 via conductor 42, its gate connected to the VDD voltage terminal 34 via conductor 46, and its source connected to electrical ground or VSS at 48. It will be understood that the n-channel transistor 44 acts as a load device for the test voltage output over test lead 40. The transistor 44 is always in the on condition since its gate is always connected to the VDD voltage terminal 34 by the conductor 46. The on resistance of the transistor 44 is approximately 4,000 ohms. It will thus be seen that when the bipolar transistor 38 turns on, current will flow over conductor 42 through the load device represented by transistor 44 to cause a voltage to appear on test lead 40. Bipolar transistor 38 is turned on by applying an added function enabling voltage to the pad 26 having a magnitude of a VBE voltage (approximately 0.7 volts) over the VDD voltage. As will be explained, the most preferred embodiment of the invention is when the PNP bipolar transistor is a parasitic transistor whose emitter and base are a part of the p-channel output driver transistor 30.

Figure 3:
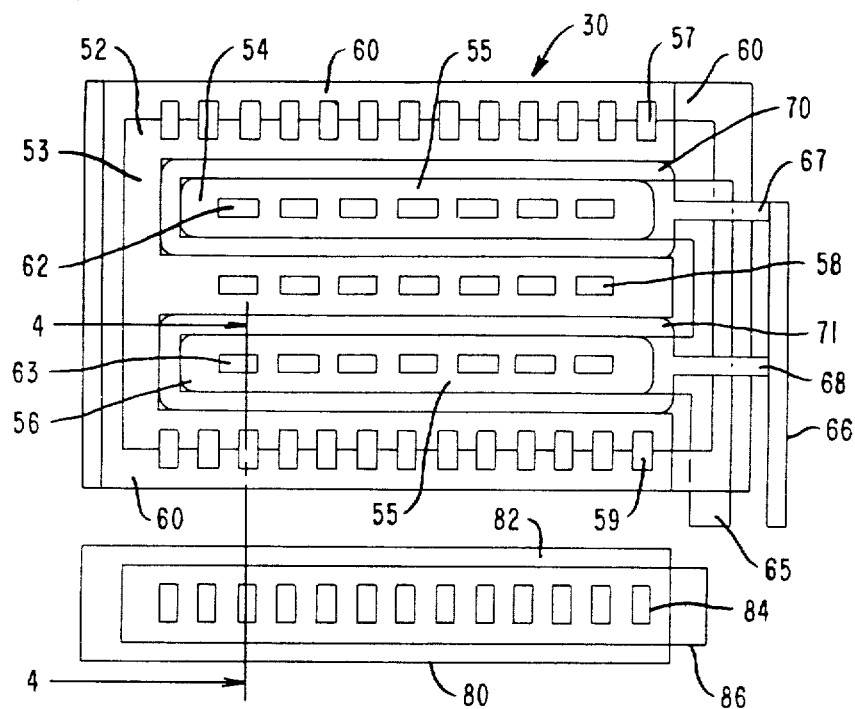
FIG. 3 is a plan view of one embodiment of mask works for merging the structure of an output driver transistor and a bipolar device of the embodiment of FIG. 2.

FIG. 3 is a plan view of one embodiment of layout for merging the structure of the p-channel output driver transistor 30 and the PNP bipolar device 38 shown within the dotted line 39 of FIG. 2. In the embodiment of FIG. 3 the PNP transistor 38 of FIG. 2 is a parasitic PNP bipolar transistor which has several of its elements in common with the elements of the p-channel output driver transistor 30. Referring now to FIG. 3, the p-channel output driver transistor 30 is shown having a p-diffusion 52 for providing the source 53 of the transistor 30, and areas of p-diffusions 54 and 56 for the drain 55. A series of contact windows 57, 58 and 59 are provided for making electrical contact between a metal interconnect (not shown) and the p diffusion 52 of the source 53. A substrate tie 60 of n+ material is provided which shares the contacts of windows 57 and 59 with the source 53. Two rows of interconnect windows 62 and 63 are provided for making an electrical connection between a metal interconnect 65 and the p-diffusion areas 54 and 56 of the drain 55. Polysilicon interconnects 66, 67 and 68 are provided for making electrical contact with gate portions 70 and 71. It will be understood that the interconnects of FIG. 3 are provided in different layers of the p-channel device 30, and thus are electrically insulated from one another.

Figure 4:
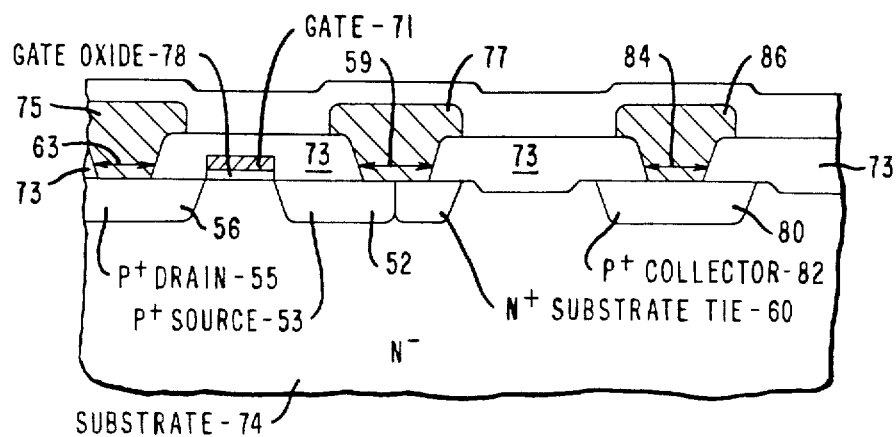
FIG. 4 is a partial cross-sectional view the merged structure of FIG. 3 taken along line 4—4 of FIG. 3.

FIG. 4 is a partial cross-sectional view of the merged p-channel driver transistor 30 and PNP bipolar transistor 38 of FIG. 3. The entire device is formed in a substrate 74 of n-type material. Portions of the p-diffusion 52 of the source 53 and p-diffusion 56 of the drain 55 are shown. The substrate 74 and areas of p-diffusion 52 and 56 are covered over with a layer of thermal oxide 73, such as $SiO_2$, through which windows 59, 63 and 84 are provided. Metal interconnect strips, typically aluminum, are shown in cross-section. One such interconnect strip 75 joins the row of windows 63 for providing electrical interconnection with the drain 55, and one such interconnect 77 provides interconnection with the row of windows 59 for providing electrical interconnection with the source 53 and the substrate 74 via substrate tie 60. An insulating layer 78 formed of silicon dioxide is provided to electrically insulate the gate 71 from the drain 55 and the source 53, as is well known. The gate 71 is formed of a polysilicon interconnect which is connected to a polysilicon strip 68 which is in turn connected to polysilicon strips 66 and 67 (see FIG.

3) for conducting electrical signals to the gate element 71. As discussed in connection with the circuit of FIG. 2, the source 53 and substrate tie 60 is connected to VDD by an appropriate connection (not shown) to interconnect 77.

Referring to both FIGS. 3 and 4, a p-diffusion 80 is provided in substrate 74 for forming a collector 82 of the parasitic PNP transistor 38. A row of windows 84 provides for electrical contact between the collector 82 and a interconnect 86. As can be seen more clearly in FIG. 4, drain 55 also forms the emitter of the parasitic PNP transistor 38, and the substrate 74 forms its base. When an added function enabling voltage of VBE above VDD is applied to the drain 55 of the p-channel device 30, the diode junction between the drain 55 and the substrate 74 is forward biased such that carriers migrate from the drain 55 to the substrate 74. As long as the voltage difference between the drain 55 and the substrate 74 is not increased too much, the carriers emitted from the drain 55 into the substrate 74 may be absorbed by their counter parts in the substrate 74. The collector 82 sweeps up some of the carriers emitted by the drain 55 such that, when the merged device of FIGS. 3 and 4 is connected as shown in FIG. 2, a current is established over conductor 42 of FIG. 2 to the n-channel load device 44, as previously explained.

Figure 5:
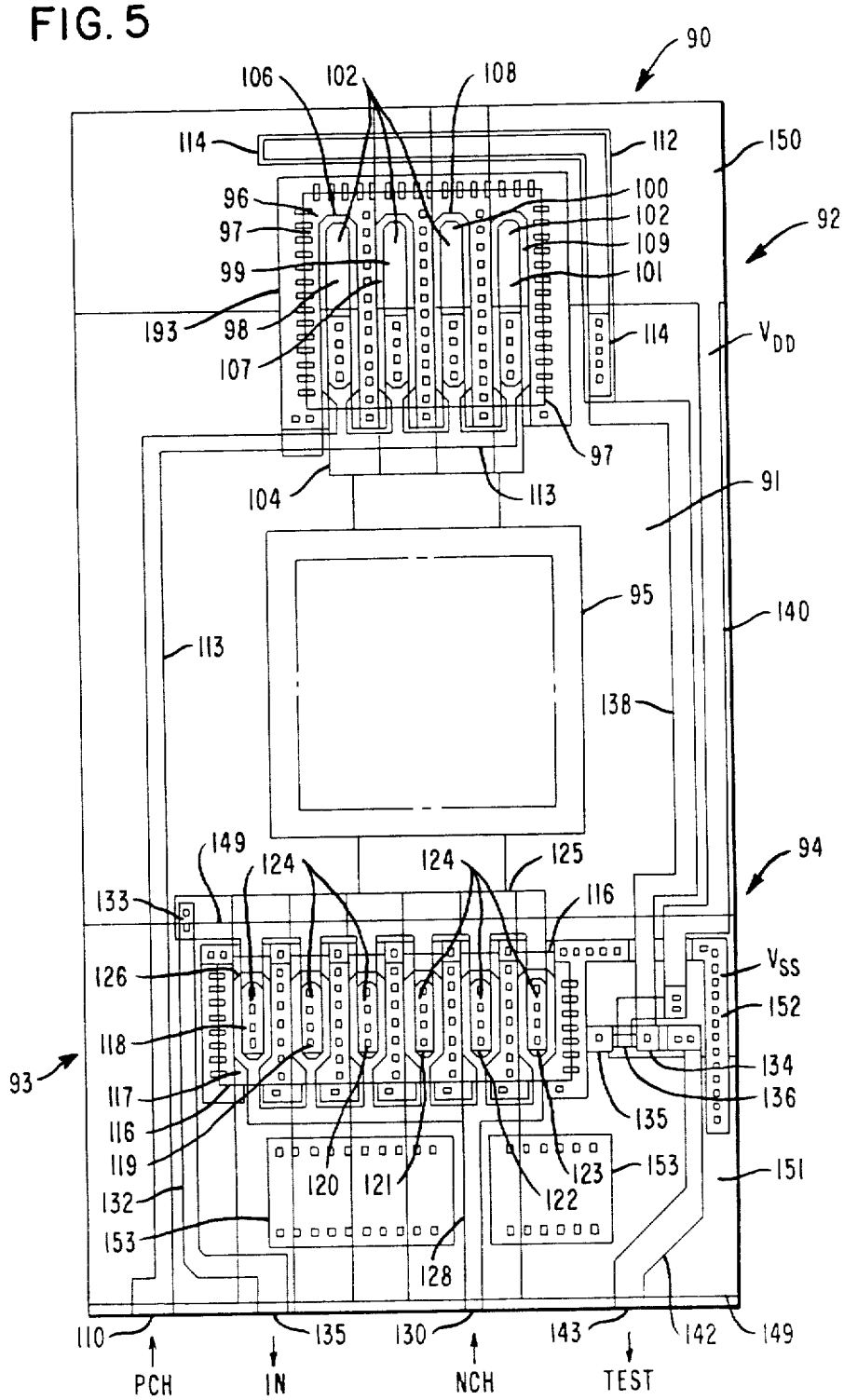
FIG. 5 is another embodiment of the present invention showing a plan view of mask works for placing all of the elements of the circuit of FIG. 2 on a single chip.

FIG. 5 is another embodiment of the circuit of the present invention in which all of the elements of FIG. 2 are placed in a single CMOS cell which may be incorporated into a single chip. The cell 90 of FIG. 5 includes a merged p-channel driver transistor and parasitic PNP bipolar device 92, an n-channel output driver transistor 93, and an n-channel load device 94. The p-channel output driver transistor of merged structure 92 corresponds to the p-channel output driver transistor 30 of FIG. 2. The n-channel output driver transistor 93 of FIG. 5 corresponds to the n-channel output driver 32 of FIG. 2. The PNP bipolar device of the merged structure 92 correspond to the PNP transistor 38 of FIG. 2, and the n-channel load device 94 of FIG. 5 corresponds to the load device 44 of FIG. 2.

The cell 90 of FIG. 5 includes a substrate 91 onto which is fixed a pad 95 which corresponds to the pad 26 of FIG. 2. The merged structure 92 of cell 90 of FIG. 5 includes an area of p-diffusion 97 forming a source 96 in the substrate 91. A plurality of p-diffusion areas 98, 99, 100 and 101 in the substrate 91 are provided for containing the drain 102 of the merged structure 92. The portions of the drain 102 and the p-diffusion areas 98, 99, 100 and 101 are connected to the pad 95 via an interconnect strip 104. Gate portions 106, 107, 108 and 109 are connected to a terminal 110 receiving a PCH signal via an interconnect strip 113. Negative PCH output driver signals are applied to the terminal 110 for placing a high on the pad 95 when the cell 90 is in its output mode. A collector 112 is formed of a p-diffusion 114 in the substrate 91 around the outer periphery of the source 96. Similar to the embodiment discussed in connection with FIGS. 3 and 4, the drain 102 acts as an emitter for the merged structure 92 of FIG. 5, the substrate 91 acts as a base, and the collector 112 completes the PNP bipolar device of the merged structure 92. Connection to the substrate 91 is provided by a substrate contact 193.

The n-channel output driver transistor 93 and the n-channel load device 94 are formed in a p-well 149 in the substrate 91. An n-diffusion 116 in the p-well 149 forms the source 117 of the n-channel output driver transistor 93. A plurality of n-diffusion areas 118, 119, 120, 121, 122 and 123 in the p-well 149 are provided for forming the drain 124 of the n-channel output driver transistor 93. The drain 124 is connected to the pad 95 via an interconnect strip 125. Gates portions, such as gate portion 126 around the n-diffusion 118, are provided for forming the gate element of the n-channel output driver transistor 93. All of the gate portions such as gate portion 126 (unnumbered for clarity) are connected by an interconnect strip 128 to an input terminal 130 for the NCH signal. It will be understood that a positive NCH signal applied to input terminal 130 will place a low voltage output on pad 95 when the cell 90 of FIG. 5 is in its output mode. A polysilicon interconnect strip 132 is connected to the interconnect strip 125 at 133 for transmitting an input signal IN from the pad 95 to the remainder of the integrated circuit (not shown) via terminal 135 when the cell 90 is in its input mode.

The n-channel load device 94 of FIG. 5 includes a drain 134, a source 135, and a gate 136. The drain 134 is connected to the collector 112 via an interconnect strip 138. The gate 136 is connected to the source 96 of the merged structure 92 via an interconnect strip 140. The drain 134 of the load device 94 is connected by a polysilicon interconnect strip 142 which provides a TEST signal via terminal 143 to the remainder of the integrated circuit chip (not shown). An appropriate connection to a metal layer 150 is made to VDD, with the metal layer 150 being connected to the source 96 of the merged structure 92 and the gate 136 of the load device 94 via strip 140. An appropriate connection to a metal layer 151 is made to VSS at interconnects 152 and 153, with the metal layer 151 being connected to the source 117 of the n-channel output driver transistor 93, and the source 135 of the load device 94. It will be understood that the cell 90 of FIG. 5 operates in a manner similar to that discussed in connection with the embodiment of FIG. 2.

Even though a PNP transistor and an n-channel load device are shown in the disclosed embodiments, it will be understood that complementary devices could be used, either alone or in combination with an n-channel output driver transistor, to provide for an added function enabling voltage of opposite polarity. It will also be understood that since the added function circuit disclosed is implemented using a minimum of devices, that the reliability of the resulting circuit will be much better than those circuits of the prior art using many more devices.

Thus, embodiments have been described which provide the aftermention objects. It will be understood by those skilled in the art that the disclosed embodiments are exemplary only, and that various elements disclosed may be replaced by equivalents without departing from the invention hereof, which equivalents are intended to be covered by the appended claim.

What is claimed is:

1. In an input/output circuit having a p-channel output driver transistor, an n-channel output driver transistor and a pad connected between the p-channel output driver transistor and the n-channel output driver transistor, said pad for receiving signals to be inputted into said input/output circuit and for being driven by the n-channel output driver transistor and the p-channel output driver transistor for providing output signals, said p-channel output driver transistor formed on an n-type substrate and having its source connected to a reference terminal for receiving a reference voltage, its drain connected to the pad, and its gate for receiving output drive signals, means for adding a function to the input/output circuit comprising:

a parasitic PNP transistor having its emitter formed by the drain of said p-channel output driver transistor, its base formed by the substrate of said p-channel output driver transistor for providing an emitter-base junction, and its collector formed by a p-diffusion in said substrate, said collector controlled by said emitter-base junction such that current flows therethrough when a voltage is applied to said pad which is sufficient to forward bias said emitter-base junction, and does not flow when said emitter-base junction is reversed biased;

a load device connected to said collector for providing an electrical load when said emitter-base junction is forward biased; and a conductor connected intermediate said collector and said load device for providing an added function voltage of a first level when said emitter-base junction is forward biased, and for providing an added function voltage of a second level when the enabling voltage applied to said pad is not sufficient to forward bias said emitter-base junction.

2. The input/output circuit of claim 1 wherein said load device is a conductively biased field effect transistor for providing a load for current flowing through said parasitic PNP transistor when said emitter-base junction is forward biased.

3. The input/output circuit of claim 2 wherein said field effect transistor is an n-channel enhancement type field effect transistor having its drain connected to the collector of said PNP transistor and its source connected to electrical ground.

4. An input/output circuit comprising:
a substrate of n-type material, having a p-well therein;
a pad on said substrate for receiving input signals for the input/output circuit, and for providing output signals from the input/output circuit;
a power terminal on said substrate for receiving a reference voltage;
a ground terminal on said substrate for connection to electrical ground;
a p-channel output driver transistor comprising;
a first source formed of a first p-diffusion in said substrate, said source being connected to said power terminal;
a first source formed of a first p-diffusion in said substrate, said drain being connected to said pad; and
a first insulated gate between said source and said drain for receiving negative output driving pulses for driving said pad high when desired;
an n-channel output driver transistor in said p-well, said n-channel output driver transistor comprising;
a second drain formed of a first n-diffusion in said p-well, said second drain connected to said pad;
a second source formed of a second n-diffusion in said p-well, said second source connected to said ground terminal; and
a second insulated gate between said second source and said second drain for receiving positive output driving pulses for driving said pad low when desired;
input conductor means connected to said pad for conducting input signals placed on said pad;
a bipolar device comprising;
an emitter in common with and formed by said first drain of said p-channel output driver transistor;
a base formed by said substrate and establishing an emitter-base junction with said emitter; and
a collector formed of a third p-diffusion in said substrate, said collector connected to said pad;
said bipolar device for providing a current from said emitter, through said base, and to said collector when a voltage sufficient to forward bias the emitter-base junction is applied on said pad, thereby turning on said bipolar device;
a load device in said p-well, said load device comprising;
a third drain formed of a third n-diffusion in said p-well, said third drain being connected to said collector of said bipolar device;
a third source formed of a fourth n-diffusion in said p-well, said third source being connected to said ground terminal, and
a third insulated gate between said third drain and said third source, said third insulated gate connected to said power terminal such that said load device is turned on, thereby presenting a load to current from said collector of said bipolar device when said bipolar device is turned on; and
added function conductor means connected intermediate said collector of said bipolar device and said third drain of said load device for conducting voltage levels thereon for enabling an added function.

* * * * *

UNITED STATES PATENT AND TRADEMARK OFFICE
CERTIFICATE OF CORRECTION

PATENT NO. : 4,714,876

DATED : December 22, 1987

INVENTOR(S) : Richard B. Gay et al.

It is certified that error appears in the above—identified patent and that said Letters Patent is hereby corrected as shown below:

Column 8, line 1, "source" should be --drain--.

Column 8, line 1, "first" should be --second--.

Signed and Sealed this

Twenty-first Day of June, 1988

Attest:

DONALD J. QUIGG

*Attesting Officer*       *Commissioner of Patents and Trademarks*